(12) United States Patent
Shigihara

(10) Patent No.: US 8,767,788 B2
(45) Date of Patent: Jul. 1, 2014

(54) SEMICONDUCTOR LASER DEVICE

(71) Applicant: Mitsubishi Electric Corporation, Tokyo (JP)

(72) Inventor: Kimio Shigihara, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 13/900,645

(22) Filed: May 23, 2013

(65) Prior Publication Data

US 2014/0098831 A1    Apr. 10, 2014

(30) Foreign Application Priority Data

Oct. 9, 2012    (JP) .................................. 2012-224367

(51) Int. Cl.
*H01S 5/00* (2006.01)
*H01S 3/06* (2006.01)
*H01S 3/07* (2006.01)

(52) U.S. Cl.
USPC ........................................ 372/45.01; 372/66

(58) Field of Classification Search
CPC ............... H01S 5/02; H01S 5/10; H01S 5/20; H01S 5/2036; H01S 5/22
USPC .......... 372/45.01, 46.013, 46.014, 46.015, 66
See application file for complete search history.

(56) References Cited

U.S. PATENT DOCUMENTS

| | | | |
|---|---|---|---|
| 2002/0146051 A1* | 10/2002 | Kuniyasu et al. | ............... 372/46 |
| 2005/0047464 A1 | 3/2005 | Shigihara et al. | |
| 2005/0254538 A1* | 11/2005 | Asatsuma et al. | ......... 372/49.01 |

FOREIGN PATENT DOCUMENTS

| | | |
|---|---|---|
| JP | 1-183603 A | 7/1989 |
| JP | 2-264488 A | 10/1990 |
| JP | 2003-60303 A | 2/2003 |
| JP | 2005-72488 A | 3/2005 |

OTHER PUBLICATIONS

K. Honda et al.; "Single stripe high power laser diodes made by Metal-Organic Chemical Vapor Deposition", *SPIE*, vol. 893 High Power Laser Diodes and Applications, pp. 16-20, (1988).

* cited by examiner

*Primary Examiner* — Armando Rodriguez
(74) *Attorney, Agent, or Firm* — Leydig, Voit & Mayer, Ltd.

(57) ABSTRACT

A semiconductor laser includes a ridge section on top of a semiconductor laminated section. The ridge section is a stripe-shaped projection or ridge and serves as a constriction structure for constricting current and light. A pair of terrace sections is located on top of the semiconductor laminated structure. The terrace sections are raised island portions sandwiching and spaced from the ridge section. An active region is located below the ridge section as viewed in plan. High refractive index regions are located on both sides of the active region and below the terrace sections, respectively. Cladding regions are located between the active region and the high refractive index regions. The high refractive index regions have a higher refractive index than the cladding regions.

3 Claims, 15 Drawing Sheets

X-X' CROSS-SECTIONAL VIEW

Y-Y' CROSS-SECTIONAL VIEW

Fig. 5

| | LOWER MODE (10th MODE) | HIGHER MODE (25th MODE) |
|---|---|---|
| ELECTRIC FIELD AT THE BOUNDARIES OF THE HIGH REFRACTIVE INDEX REGIONS | NEGLIGIBLY WEAK (ITS INTENSITY IS $6.4 \times 10^{-6}$ TIMES THE PEAK FIELD INTENSITY) | SIGNIFICANT (ITS INTENSITY IS 0.059 TIMES THE PEAK FIELD INTENSITY, I.E., MORE THAN 5% OF THE PEAK FIELD INTENSITY) |
| ENERGY LOSS | NEGLIGIBLY WEAK | SIGNIFICANT |
| OSCILLATION | OCCUR | NOT OCCUR |
| ANGLE OF LIGHT EMISSION FROM THE FRONT FACET | SMALL (RELATIVELY LARGE ANGLE OF INCIDENCE $\theta_1$ RELATIVE TO THE CLADDING REGIONS) | LARGE (RELATIVELY SMALL ANGLE OF INCIDENCE $\theta_1$ RELATIVE TO THE CLADDING REGIONS) |
| LIGHT BRIGHTNESS | HIGH | LOW |

X-X' CROSS-SECTIONAL VIEW (MOUNTING STRUCTURE)

Y-Y' CROSS-SECTIONAL VIEW (MOUNTING STRUCTURE)

SEMICONDUCTOR LASER DEVICE

BACKGROUND OF THE INVENTION

1. Field of the Invention

The present invention relates to a semiconductor laser device, and more particularly to a so-called broad area semiconductor laser device.

2. Background Art

Broad area semiconductor laser devices have an advantage, among others, that they can produce high output power. Conventional broad area semiconductor laser devices have an electrode stripe structure having a width of 50 μm or 160 μm, as disclosed, e.g., in K. Honda, T. Mamine, and M. Ayabe, "Single stripe high power laser diodes made by Metal-Organic Chemical Vapor Deposition," SPIE, Vol. 893, High Power Laser Diodes and Applications, pp. 16-20, 1988.

Further, semiconductor lasers with a stripe structure which are not broad area semiconductor laser devices are disclosed in Japanese Laid-Open Patent Publications Nos. H01-183603, H02-264488, 2003-060303, and 2005-072488.

The above Japanese Laid-Open Patent Publication No. H01-183603 discloses a structure in which high order mode cutoff regions are provided on both sides of a tapered core region, with cladding regions being interposed between the tapered core region and the high order mode cutoff regions. The width of the core region described in this publication is narrow at one end so that only the fundamental mode of oscillation can occur or develop therein.

Thus, this semiconductor laser device has a different structure than broad area semiconductor laser devices and hence cannot produce high output power. It should be noted that, as shown in FIG. 4 of this publication, the semiconductor laser device has a structure having a refractive index distribution and a propagation coefficient for each mode so that only the fundamental mode of oscillation can occur therein and all higher order modes are prevented from occurring.

The semiconductor laser device disclosed in the above Japanese Laid-Open Patent Publication No. H02-264488 also has a narrow stripe region in which only the fundamental mode of oscillation can occur. Therefore, unlike broad area semiconductor laser devices, this semiconductor laser device cannot produce high output power.

According to this publication, the stripe of the semiconductor laser device has a narrowed portion which prevents all modes other than the fundamental mode from occurring; that is, this semiconductor laser device is a semiconductor laser having a resonator structure in which only the fundamental mode of oscillation can occur and all higher order modes are prevented from occurring.

The above Japanese Laid-Open Patent Publication Nos. 2003-060303 and 2005-072488 also disclose single mode semiconductor laser devices, not broad area semiconductor laser devices.

Broad area semiconductor laser devices tend to have a large horizontal beam divergence angle, typically in the range of approximately 10-13 degrees. This large beam divergence angle results in a decrease in the brightness of the light emitted from the broad area semiconductor laser device.

SUMMARY OF THE INVENTION

The present invention has been made to solve the above problems. It is, therefore, an object of the present invention to provide a broad area semiconductor laser device capable of emitting increased brightness light.

According to one aspect of the present invention, semiconductor laser device includes: a semiconductor substrate; a semiconductor laminated section; a ridge section; and a pair of terrace sections.

The semiconductor laminated section includes a first conductivity type cladding layer, an active layer, and a second conductivity type cladding layer, sequentially stacked on the semiconductor substrate, and which has a front facet and a rear facet facing in resonator length direction.

The ridge section is formed on top of the semiconductor laminated section.

The pair of terrace sections are provided on top of the semiconductor laminated section. The pair of terrace sections are spaced from the ridge section, and the pair of terrace sections sandwiches the ridge section.

The ridge section has a width of 50 μm or more. The active layer is divided into an active region, under-the-terrace-section regions, and cladding regions. The active region is located below the ridge section as viewed in plan. The under-the-terrace-section regions are located on both sides of the active region and below the terrace sections as viewed in plan. The cladding regions are located between the active region and the under-the-terrace-section regions.

The under-the-terrace-section regions are high refractive index regions having a higher refractive index than the cladding regions.

The semiconductor laser device is configured to satisfy a relation:

$$(2\pi/\lambda) \times (n_a^2 - n_c^2)^{1/2} \times (W/2) > \pi/2$$

where $\lambda$ represents lasing wavelength of the semiconductor laser device, $n_a$ represents effective refractive index of the active region, $n_c$ represents effective refractive index of the cladding regions, and W represents width of the active region.

Other and further objects, features and advantages of the invention will appear more fully from the following description.

BRIEF DESCRIPTION OF THE DRAWINGS

FIG. 5 is a table listing features and advantages of the semiconductor laser device of First Embodiment.

DETAILED DESCRIPTION OF THE PREFERRED EMBODIMENTS

First Embodiment
[Configuration of Device of First Embodiment]

A semiconductor laser device 30 in accordance with a first embodiment of the present invention is a 980 nm broad area semiconductor laser device. Generally, broad area semiconductor laser devices have a stripe region having a width so that a plurality of modes of oscillation can occur in a horizontal transverse direction in the laser device. In contrast with these broad area semiconductor laser devices, there are semiconductor laser devices (single mode semiconductor laser devices) configured so that only the fundamental mode of oscillation can occur therein. These semiconductor laser devices have a narrow stripe region, as described in the Patent Publications noted above. Broad area semiconductor laser devices are advantageous in that they can produce higher output power than single mode semiconductor laser devices.

Figure 1:
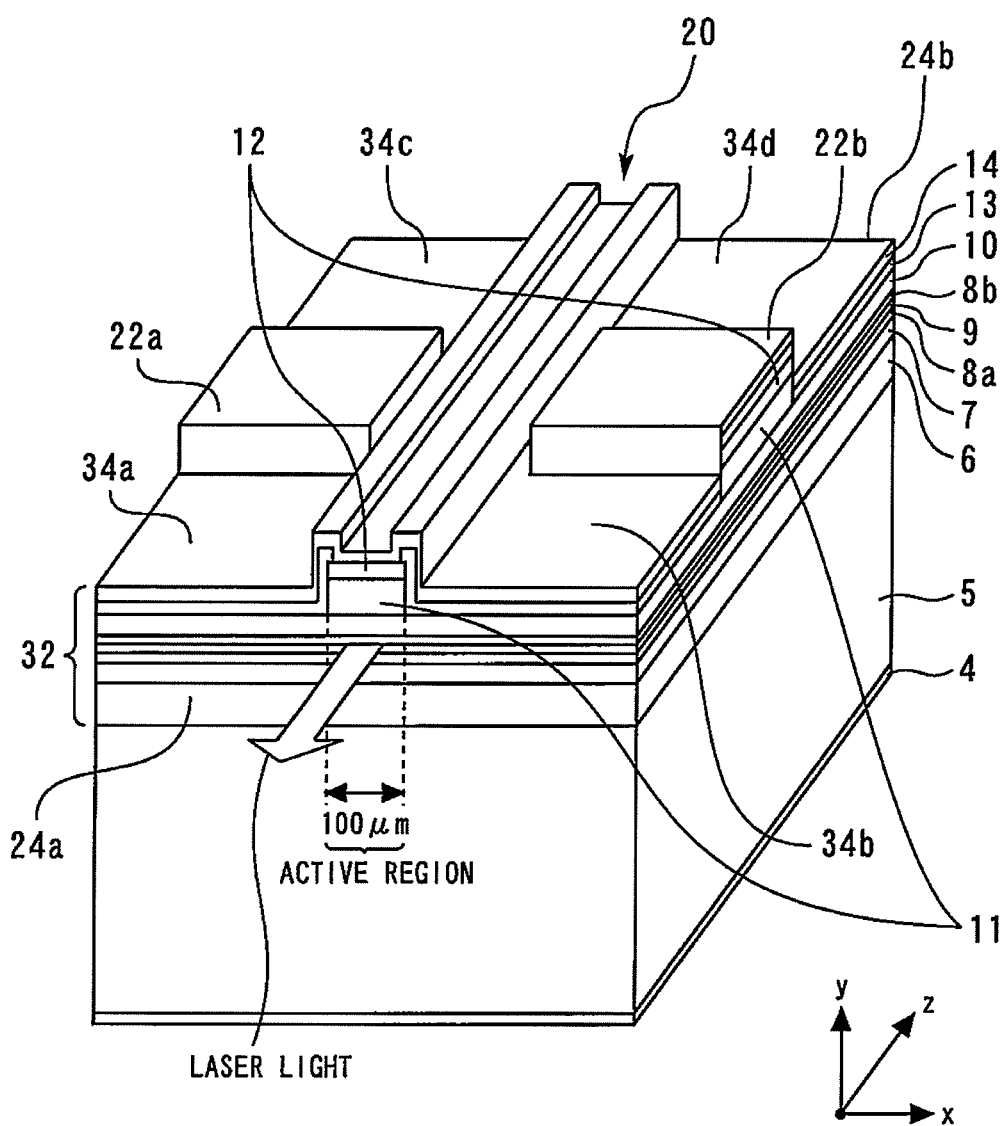
FIG. 1 is a perspective view schematically showing the configuration of the semiconductor laser device of First Embodiment.

FIG. 1 is a perspective view schematically showing the configuration of the semiconductor laser device 30 of the first embodiment.

The semiconductor laser device 30 includes an n-type substrate 5, a semiconductor laminated section 32, a ridge section 20, and a pair of terrace sections 22a and 22b. The semiconductor laminated section 32 includes a first conductivity type cladding layer (or n-type AlGaAs cladding layer 6), an active layer (including an undoped InGaAs well layer 8a, an undoped AlGaAs barrier layer 9, and an undoped InGaAs well layer 8b), and a second conductivity type cladding layer (or p-type AlGaAs cladding layer 11), sequentially stacked on the n-type substrate 5. The semiconductor laminated section 32 has a front facet 24a and a rear facet 24b which face along the length of the resonator. The laser light generated in the laser device is emitted from the front facet 24a.

Figure 4:
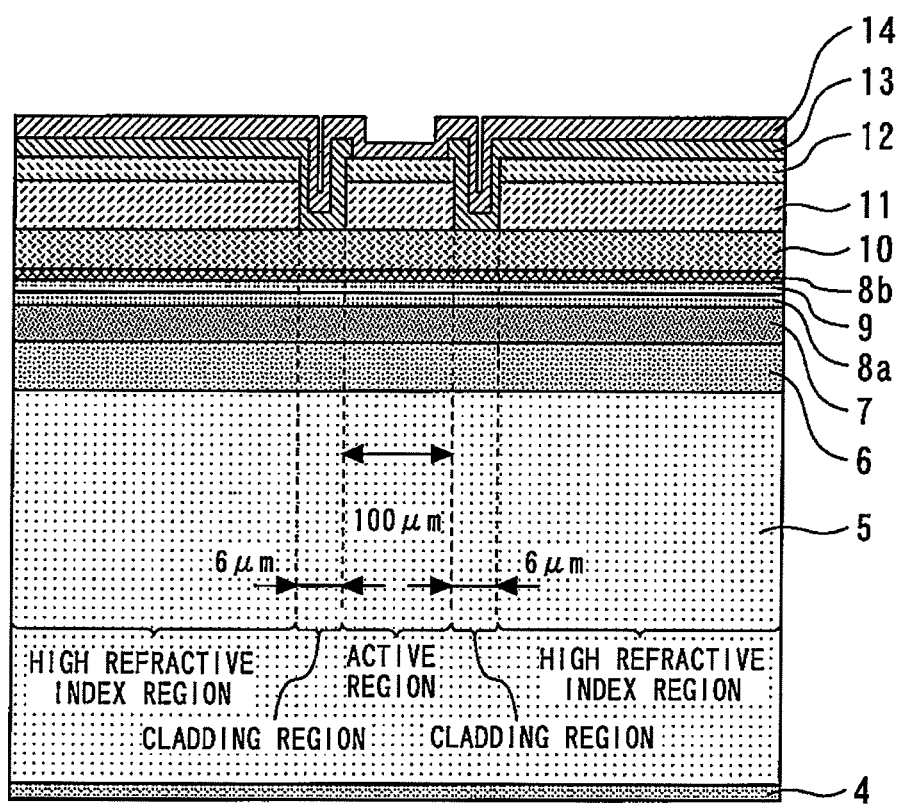
FIG. 4 is a diagram schematically showing a cross-sectional structure of the semiconductor laser device taken along line Y-Y' of FIG. 2.

The ridge section 20 is formed on top of the semiconductor laminated section 32. The ridge section 20 is a stripe-shaped projection or ridge and serves as a constriction structure for constricting current and light. The pair of terrace sections 22a and 22b are provided on top of the semiconductor laminated section 32. The pair of terrace sections 22a and 22b are raised island portions sandwiching and spaced from the ridge section 20; specifically, in the first embodiment the terrace sections 22a and 22b sandwich the central portion of the ridge section 20 therebetween. As shown in FIG. 4, in the semiconductor laser device 30, the ridge section 20 and the terrace sections 22a and 22b have the same height. The reason for this is that each layer of the laminated structure of the ridge 20 has the same thickness as the corresponding layer of the laminated structures of the terrace sections 22a and 22b.

The layer structure of the semiconductor laser device 30 will be described in more detail below. The semiconductor laser device 30 is configured by forming the semiconductor laminated section 32 on the n-type substrate 5. This semiconductor laminated section 32 includes the n-type AlGaAs cladding layer 6, an undoped AlGaAs guiding layer 7, the undoped InGaAs well layer 8a, the undoped AlGaAs barrier layer 9, the undoped InGaAs well layer 8b, an undoped AlGaAs guiding layer 10, the p-type AlGaAs cladding layer 11, a p-type GaAs contact layer 12, and an SiN film 13. The semiconductor laminated section 32 are formed by stacking (or growing) these layers on top of one another on the n-type substrate 5.

The n-type AlGaAs cladding layer 6 has an Al mole fraction of 0.25 and a thickness of 1.5 μm. The undoped AlGaAs guiding layer 7 has an Al mole fraction of 0.15 and a thickness of 700 nm. The undoped InGaAs well layers 8a and 8b have an In mole fraction of 0.14 and a thickness of 8 nm. The undoped AlGaAs barrier layer 9 has an Al mole fraction of 0.15 and a thickness of 8 nm. The undoped AlGaAs guiding layer 10 has an Al mole fraction of 0.15 and a thickness of 700 nm. The p-type AlGaAs cladding layer 11 has an Al mole fraction of 0.25 and a thickness of 1.5 μm. The p-type GaAs contact layer 12 has a thickness of 200 nm. The SiN film 13 has a thickness of 200 nm.

A p-electrode 14 is provided on the SiN film 13. An n-electrode 4 is provided on the bottom surface of the n-type substrate 5.

The details of the ridge section 20 will be described. The ridge section 20 of the semiconductor laser device 30 of the present embodiment has a width of 100 μm. Further, the semiconductor laser device 30 is configured to satisfy Equation (1) below.

$$(2\pi/\lambda) \times (n_a^2 - n_c^2)^{1/2} \times (W/2) > \pi/2 \tag{1}$$

where: $\lambda$ is the lasing wavelength, $n_a$ is the effective refractive index of the active region 1 (described later), $n_c$ is the effective refractive index of the cladding regions, and W is the width of the active region 1. It should be noted that the active region 1 may not have a uniform refractive index. The "effective refractive index" of the active region 1 refers to an average refractive index experienced by light propagating through the active region 1 in the z-direction. That is, even if the layers constituting the active region 1, which are stacked in the y-direction, have different refractive indices and different thicknesses, the refracting effect of the entire active region 1 on the light propagating through the active region 1 in the z-direction can be represented by the effective refractive index $n_a$ of the active region 1.

The pair of terrace sections 22a and 22b are disposed so as to sandwich the central portion of the length of the ridge section 20 extending along the length of the resonator. The top part of the semiconductor laminated section 32 is provided with first sections 34a and 34b and second sections 34c and 34d, in addition to the ridge section 20 and the terrace sections 22a and 22b. The first sections 34a and 34b are regions sandwiching the end portion of the ridge section 20 on the front facet 24a side of the semiconductor laminated structure 32. The second sections 34c and 34d are regions sandwiching the end portion of the ridge section 20 on the rear facet 24b side of the semiconductor laminated structure 32. Further, the terrace section 22a is sandwiched between the first section 34a and the second section 34c and the terrace section 22b is sandwiched between the first section 34b and the second section 34d, as viewed in plan.

The first sections 34a and 34b and the second sections 34c and 34d are lower in height than the ridge section 20 and the terrace sections 22a and 22b. The reason for this is that the first sections 34a and 34b and the second sections 34c and 34d do not have the p-type AlGaAs cladding layer 11.

Figure 2:
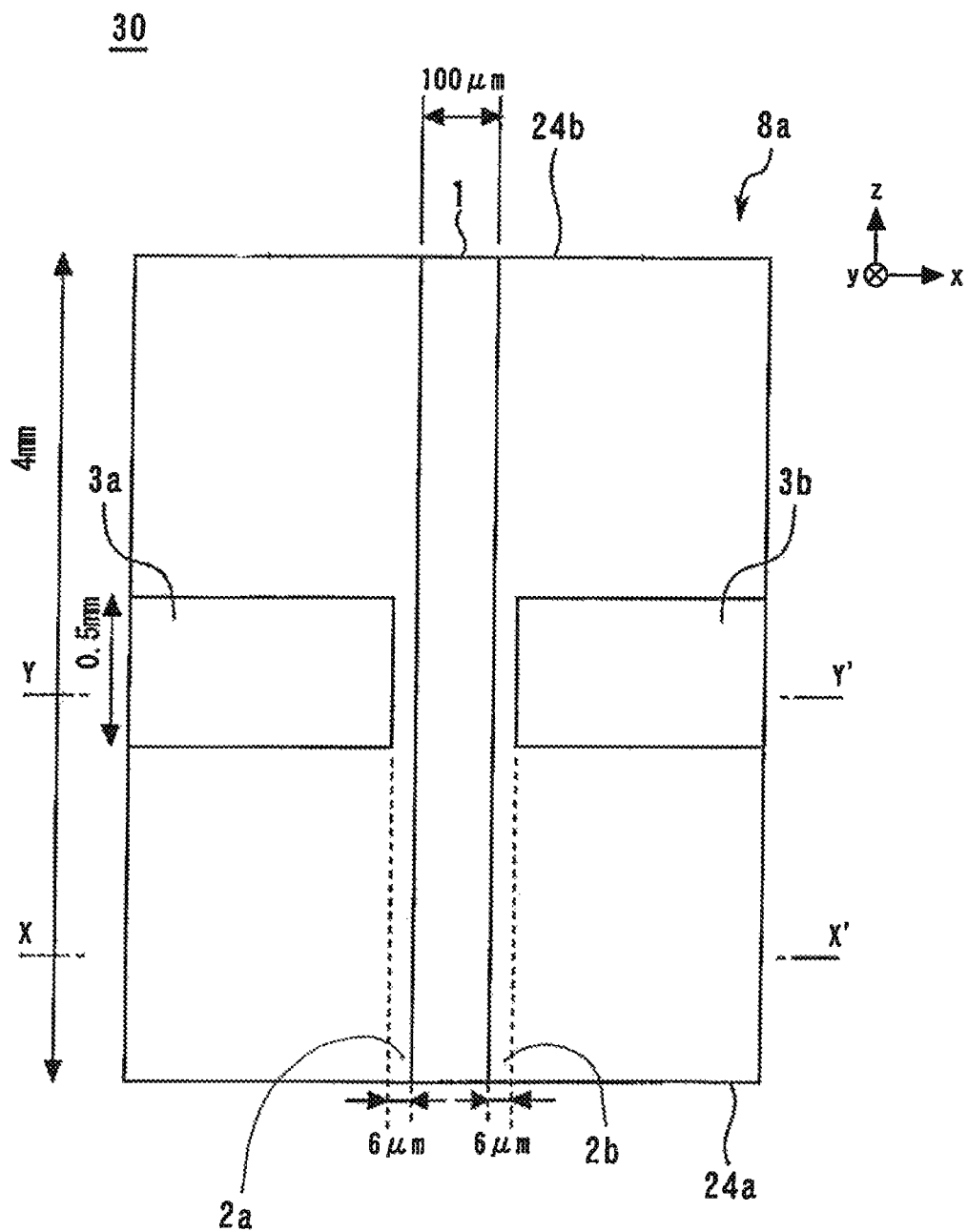
FIG. 2 is a plan view schematically showing the active region, the cladding regions, and the high refractive index regions of the semiconductor laser device of First Embodiment.

FIG. 2 is a plan view schematically showing the active region, the cladding regions, and the high refractive index regions of the semiconductor laser device 30 of the first embodiment. Specifically, FIG. 2 is a diagram illustrating the way in which the active layer (including the undoped InGaAs well layer 8a, the undoped AlGaAs barrier layer 9, and the undoped InGaAs well layer 8b) of the semiconductor laser device 30 is divided into the active region 1, the cladding regions 2a and 2b, and the high refractive index regions 3a and 3b. FIG. 2 is a plan view showing the top surface of the undoped InGaAs well layer 8a.

The active region 1 is a region located below the ridge section 20, as viewed in plan. The high refractive index regions 3a and 3b are regions located on both sides of the active region 1 and below the terrace sections 22a and 22b, as viewed in plan. The high refractive index regions 3a and 3b are also referred to hereinafter as the under-the-terrace-section regions, for convenience. The cladding regions 2a and 2b are regions located between the active region 1 and the high refractive index regions 3a and 3b, respectively. The high refractive index regions 3a and 3b have a higher refractive index than the cladding regions 2a and 2b. Thus, the active region 1 and the high refractive index regions 3a and 3b, shown in a plan view in FIG. 2, correspond to the ridge section 20 and the terrace sections 22a and 22b, respectively, of the semiconductor laser device 30 as viewed from above the ridge section 20.

As shown in FIG. 2, in the first embodiment, the width of the active region 1, i.e., the width of the ridge stripe, is 100 µm, and the length of the resonator is 4 mm. Further, in the first embodiment, the high refractive index region 3a is formed in the outer central portion of the cladding region 2a, and the high refractive index region 3b is formed in the outer central portion of the cladding region 2b. These high refractive index regions are 0.5 mm long and have a higher refractive index than the cladding regions 2a and 2b.

Figure 3:
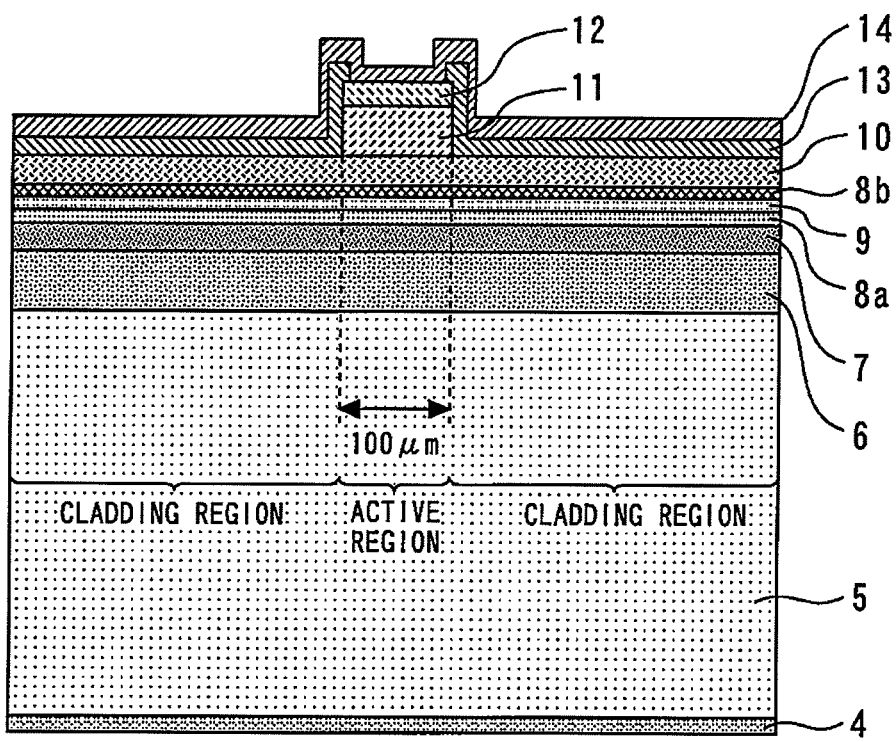
FIG. 3 is a diagram schematically showing a cross-sectional structure of the semiconductor laser device taken along line X-X' of FIG. 2.

FIG. 3 is a diagram schematically showing a cross-sectional structure of the semiconductor laser device 30 taken along line X-X' of FIG. 2. The semiconductor laser device 30 includes the n-type AlGaAs cladding layer 6, the undoped AlGaAs guiding layer 7, the undoped InGaAs well layer 8a, the undoped AlGaAs barrier layer 9, the undoped InGaAs well layer 8b, the undoped AlGaAs guiding layer 10, the p-type AlGaAs cladding layer 11, and the p-type GaAs contact layer 12, sequentially grown in crystalline form on the n-type substrate 5 of n-type GaAs by Metal Organic Chemical Vapor Deposition (MOCVD).

In accordance with the present embodiment, after these layers are formed on the n-type substrate 5, the p-type GaAs contact layer 12 and the p-type AlGaAs cladding layer 11 are selectively etched away except for the portions forming the ridge section 20. Further, the entire top surface of the laminated structure except for the top surface of the ridge section 20 is covered by the SiN film 13, the p-electrode 14 is then formed on the SiN film 13, and the n-electrode 4 is formed on the bottom surface of the n-type GaAs substrate 5.

FIG. 4 is a diagram schematically showing a cross-sectional structure of the semiconductor laser device 30 taken along line Y-Y' of FIG. 2. This cross-section also includes the layers described in connection with the cross-section of FIG. 3. The configurations of these layers and the way in which they are grown in crystalline form on the substrate are basically the same as those described above. However, this cross-section differs from that of FIG. 3 in that the p-type AlGaAs cladding layer 11 is provided with raised island portions for forming the terrace portions 22a and 22b.

Specifically, referring to the plan view of FIG. 2, these raised island portions (or terrace sections 22a and 22b) are formed at the same time as when the ridge section 20 is formed, by selectively removing portions of the p-type GaAs contact layer 12 and the p-type AlGaAs cladding layer 11. That is, the p-type AlGaAs cladding layer 11 and the p-type GaAs contact layer 12 are etched away except for the portions forming the ridge portion 20 and the raised island portions (or terrace sections 22a and 22b), said raised island portions sandwiching the central portion of the ridge section 20 therebetween and having a length of 0.5 mm extending along the length of the resonator. (The raised island portions are located above the high refractive index regions 3a and 3b shown in FIG. 2.) More specifically, the p-type GaAs contact layer 12 and the p-type AlGaAs cladding layer 11 are partially etched away so that a gap 6 µm wide and 0.5 mm long is formed between the ridge section 20 (or the active region 1 shown in FIG. 2) and the terrace sections 22a and 22b (or the high refractive index regions 3a and 3b shown in FIG. 2). This gap defines the cladding regions 2a and 2b. Further, the SiN film 13 is formed over the entire top surface of the semiconductor laser device 30 except for the top surface of the ridge section 20, and the p-electrode 14 is formed on the SiN film 13, as shown in FIGS. 1, 3, and 4.

[Operation of Device of First Embodiment]

When a voltage is applied between the n-electrode 4 and the p-electrode 14 of the semiconductor laser device 30, electrons are injected from the n-electrode side of the laser device into the undoped InGaAs well layer 8a, and holes are injected from the p-electrode side into the undoped InGaAs well layer 8b. These electrons and holes then recombine to emit laser light. This laser light from the InGaAs well layers 8a and 8b has a wavelength of 0.98 µm. Since the active region 1 has a straight stripe shape and a refractive index higher than the refractive index of the surrounding cladding regions 2a and 2b, the laser light is confined primarily within the active region 1.

The semiconductor laser device 30 includes the active region 1 and the cladding regions 2a and 2b. In according with the present embodiment, the active region 1 has a width of 100 µm and the semiconductor laser device 30 is configured to satisfy Equation (1) set forth above. Since the semiconductor laser device 30 (or the active region 1 and the cladding regions 2a and 2b) satisfies the condition expressed by Equation (1), the active region 1 and the cladding regions 2a and 2b forms a straight multimode waveguide in which a plurality of modes of oscillation including the fundamental mode (or zeroth order mode) can occur. It should be noted, however, that in the semiconductor laser device 30 of the first embodiment the high refractive index regions 3a and 3b having a higher refractive index than the cladding regions 2a and 2b are disposed in the outer central portions of the cladding regions 2a and 2b, respectively, within the resonator. As a result, fewer modes of oscillation can possibly occur within the resonator than would be the case without the high refractive index regions 3a and 3b, making it possible to reduce the divergence angle of the laser beam emitted from the semiconductor laser device. This effect will be described in more detail.

(Number of Modes)

If the semiconductor laser device 30 of the present embodiment were not provided with the high refractive index regions 3a and 3b in its resonator, that is, if the semiconductor laser device 30 had the same cross-sectional configuration along its entire length which is similar to that shown in the cross-sectional view of FIG. 3 (taken along line X-X' of FIG. 2), then the zeroth to 25th modes of oscillation could possibly occur within the resonator, which is determined by the effective refractive index of the active region 1, the effective refractive indices of the cladding regions 2a and 2b, and the width of the active region 1.

The number of modes of oscillation that can occur in a resonator can be calculated by solving the wave equation for the boundary conditions imposed by the waveguide structure. Generally, the number of modes of oscillation supported by the resonator is dependent on the lasing wavelength, the refractive indices of the active region 1 and the cladding regions 2a and 2b, and the width of the active region 1. The number of possible modes increases with decreasing lasing wavelength, increasing difference in refractive index between the active region 1 and the cladding regions 2a and 2b, and increasing width of the active region 1.

If the semiconductor laser device 30 of the present embodiment were not provided with the high refractive index regions 3a and 3b in its resonator (i.e., not provided with the terrace sections 22a and 22b), then a total of 26 modes of oscillation (i.e., the zeroth to 25th modes) could possibly occur. The number of modes that can occur in the resonator may be changed by changing the difference in refractive index between the active region 1 and the cladding regions 2a and 2b. This may be accomplished by forming the cladding regions 2a and 2b by etching in a different manner than that described above. For example, the etching for forming the cladding regions 2a and 2b may be stopped when a depth halfway through the p-type AlGaAs cladding layer 11 or the undoped AlGaAs guiding layer 10 has been reached. Further, the active region 1 (or ridge section 20) may be formed to have a different width (e.g., 150 μm) to change the number of modes of oscillation. In this way, the number of possible modes of oscillation can be set.

A semiconductor laser device can laser in a plurality of modes if Equation (1) noted above is satisfied. Specifically, referring to Equation (1), when the lasing wavelength λ is 0.98 μm and the width W of the active region 1 is 50 μm, the waveguide functions as a multimode waveguide, in which a plurality of modes of oscillation can occur, if $(n_a^2 - n_c^2)^{1/2}$ is greater than 0.0098, where $n_a$ is the effective refractive index of the active region 1 and $n_c$ is the effective refractive index of the cladding regions. In the present embodiment, since the effective refractive index $n_a$ of the active region 1 is 3.41606, a plurality of modes of oscillation can occur in the waveguide (or resonator) if the effective refractive index $n_c$ of the cladding regions 2a and 2b is 3.41604 or less. This can be easily accomplished by etching away 0.85 μm of thickness from the p-type AlGaAs cladding layer 11. It should be noted that removing the entire p-type AlGaAs cladding layer 11 (as in the first embodiment) results in a further decrease in the refractive index of the cladding regions, so that 26 modes of oscillation can occur in the waveguide. A semiconductor laser device which differs in composition, material, and/or dimension from the semiconductor laser device 30 of the present embodiment can also be designed in this manner.

(Features and Advantages)

FIG. 5 is a table listing features and advantages of the semiconductor laser device 30 of the first embodiment. These features and advantages are itemized into 5 items (item #1 to item #5) for convenience of explanation.

(1) The electric field at the boundaries of the high refractive index regions 3a and 3b is negligibly weak in low order modes, e.g., in the tenth order mode (its intensity is $6.4 \times 10^{-6}$ times the peak field intensity). On the other hand, the electric filed in high order modes, e.g., in the 25th order mode is significant (its intensity is 0.059 times the peak field intensity, i.e., more than 5% of the peak field intensity).

(2) As a result of the above, the energy loss of low order modes (e.g., the tenth order mode) is negligibly low, whereas the energy loss of high order modes (e.g., the 25th order mode) is significant.

(3) If there is a difference in energy loss between two modes, the lower loss mode of oscillation occurs. This means that, in the semiconductor laser device 30 of the present embodiment, low order modes (e.g., the tenth order mode) of oscillation will occur, whereas high order modes (e.g., the 25th order mode) of oscillation do not occur. That is, it is possible to selectively produce low order modes of oscillation in the semiconductor laser device.

Figure 7:
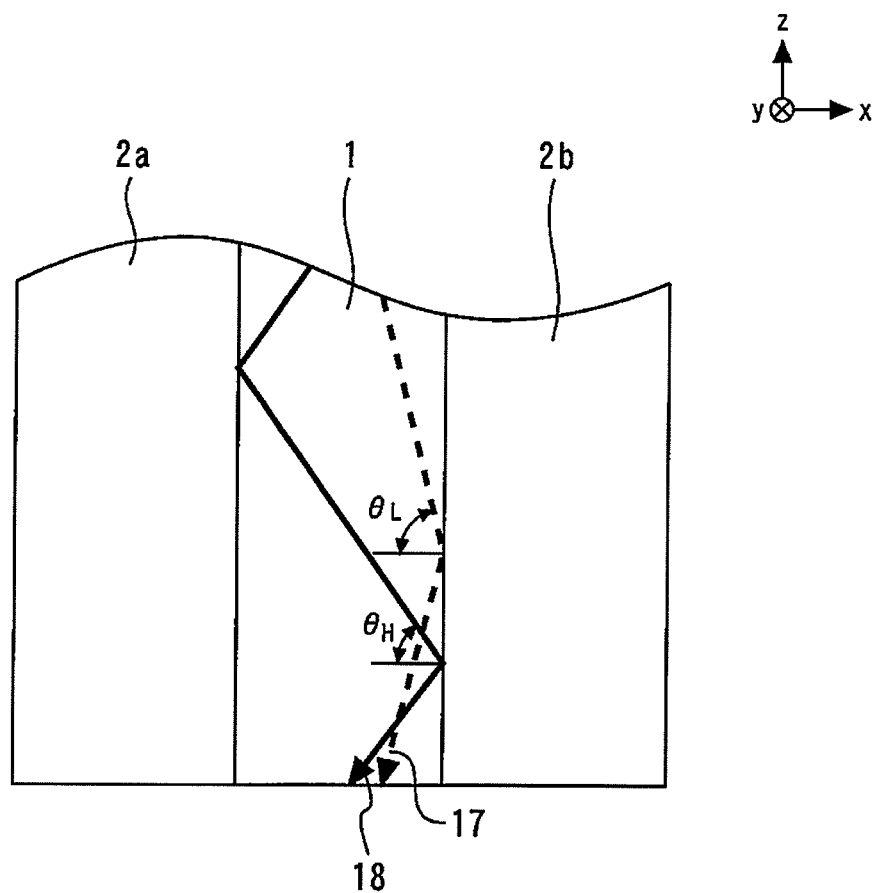
FIG. 7 is a schematic diagram showing the paths traveled by representative high and low order waveguide modes of light within the active region.

(4) Low order modes (e.g., the tenth order mode) of light (or waves) have a relatively large angle of incidence θL relative to the cladding regions 2a and 2b (see FIG. 7). High order modes (e.g., the 25th order mode) of light (or waves), on the other hand, have an angle of incidence θH smaller than the angle of incidence θL relative to the cladding regions 2a and 2b (see FIG. 7). As a result, the angle of light emission from the front facet is smaller in low order modes (e.g., the tenth order mode) and larger in high order modes (e.g., the 25th order mode).

(5) The brightness of the light emitted from the semiconductor laser device 30 is as follows. Low order modes (e.g., the tenth order mode) of light have high brightness whereas high order modes (e.g., the 25th order mode) of light have low brightness. Therefore, the semiconductor laser device 30 can emit high brightness light, since the device can be caused to lase in low order modes.

The features and advantages summarized in items #1 to #5 above will be described in more detail below.

(Relationship between Mode Order and Electric Field Distribution)

Figure 6:
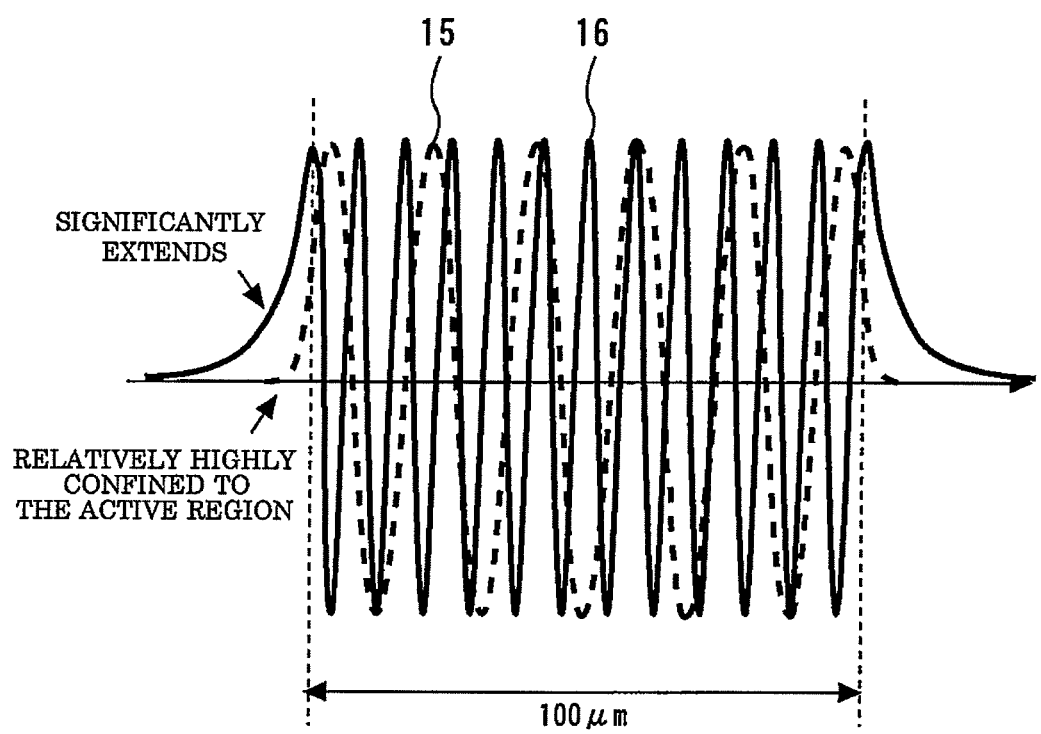
FIG. 6 is a diagram showing the electric field distributions in the tenth order mode (a low order mode) and in the 24th order mode (a high order mode), wherein the tenth order mode is represented by a dashed line and the 24th order mode is represented by a solid line.

FIG. 6 is a diagram showing the electric field distributions in the tenth order mode (a low order mode) and in the 24th order mode (a high order mode), wherein the tenth order mode is represented by a dashed line and indicated by the reference numeral 15 and the 24th order mode is represented by a solid line and indicated by the reference numeral 16. In multimode waveguides, the way in which the electric field is confined within the active region 1 differs depending on the order of the mode of oscillation. The lower the order of the mode, the more electric field is confined within the active region 1. The electric field (distribution) extends further beyond the boundaries of the active region 1 as the order of the mode of oscillation increases. It should be noted that the square of an electric field distribution is a power distribution, typically referred to as an optical intensity distribution.

As shown in FIG. 6, the tenth order mode electric field (dashed line) is relatively highly confined to the active region 1. In contrast, the 24th order mode electric field (solid line) extends significantly beyond the width (100 μm) of the active region 1 into the cladding regions 2a and 2b.

The modes of oscillation that can occur in the resonator are found by solving the wave equation for the boundary conditions imposed by the waveguide structure. A sine or cosine vibration solution is obtained for the electric field in the active region 1, which has a high refractive index, while an exponentially damped solution is obtained for the electric field in the cladding regions 2a and 2b, which has a low refractive index.

(Relationship between High Refractive Index Regions and Loss)

The following description will be directed to the effect of the high refractive index regions 3a and 3b disposed in the outer central portions of the cladding regions 2a and 2b, respectively, within the resonator. The electric fields in the cladding regions 2a and 2b exponentially decrease with increasing distance from the active region 1 and are zero at infinite distance. The electric field intensity level is not zero at finite distance from the active region 1. However, the electric fields in the cladding regions 2a and 2b may be ignored if their intensity is substantially zero as compared to the peak field intensity value.

The electric fields in the high refractive index regions 3a and 3b are also found by solving the wave equation for these regions; a sine or cosine vibration solution is obtained, as is the case with the active region 1. If the electric field extending beyond the active region 1 is substantially attenuated within the cladding regions 2a and 2b and hence its intensity levels at the boundaries between the cladding region 2a and the high refractive index region 3a and between the cladding region 2b and the high refractive index region 3b can be regarded as zero, then the intensity levels of the electric field in the high refractive index regions 3a and 3b can also be regarded as zero. In this case, the electric field propagates along the length of the resonator (z-direction) without being affected by the high refractive index regions 3a and 3b.

If, on the other hand, the electric field extending beyond the active region 1 is not adequately attenuated within the cladding regions 2a and 2b and hence its intensity levels at the boundaries between the cladding region 2a and the high refractive index region 3a and between the cladding region 2b and the high refractive index region 3b are significant (i.e., cannot be regarded as zero), then the electric field extending beyond the cladding regions 2a and 2b sinusoidally (or cosinusoidally) vibrates in the high refractive index regions 3a and 3b. This vibrating electric field propagates along the length of the resonator (z-direction) while transmitting energy in the x-direction, resulting in considerable energy loss when this mode of oscillation occurs in the resonator.

The intensity of the tenth order mode electric field at a distance of 6 μm from each longitudinal edge of the active region 1 is $6.4 \times 10^{-6}$ times the peak field intensity in the active region 1. Since the value $6.4 \times 10^{-6}$ is significantly lower than 1, it is possible to ignore the tenth order mode electric field at a distance of more than 6 μm from each longitudinal edge of the active region 1. This means that the tenth order mode electric field does not substantially transmit energy in the x-direction, making it possible to ignore the energy loss of the tenth order mode electric field in the high refractive index regions 3a and 3b.

On the other hand, the intensity of the 24th order mode electric field at a distance of 6 μm from each longitudinal edge of the active region 1 is 0.059 times the peak field intensity in the active region 1, that is, more than 5% of the peak field intensity. Therefore, the 24th order mode electric field in the high refractive index region 3a and 3b is significant and vibrates and thereby transmits energy in the x-direction, resulting in energy loss. This means that the high refractive index regions 3a and 3b disposed in the outer central portions of the cladding regions 2a and 2b, respectively, serve to increase the energy loss of high order modes of oscillation.

It should be noted that if it were not for the high refractive index regions 3a and 3b, even high order mode electric fields would not transmit energy in the x-direction and hence would not cause any energy loss, since no vibration solution would be obtained from the wave equation for the electric fields outside the active region 1.

(Relationship between Mode Loss and Oscillation)

Generally, the active layer of a semiconductor laser produces gain when a current is injected into the layer. The greater the amount of current injected, the higher the resulting gain. Lasing occurs when this gain is equal to the loss in the semiconductor laser. When the active region is configured so that a plurality of modes of oscillation can occur therein, if there is no difference in energy loss between these modes, then all of these modes may occur when the semiconductor laser lases. In this case, the semiconductor laser emits a beam having a large divergence angle.

If, on the other hand, there is a difference in energy loss between the modes, then lower loss modes are more likely to occur than higher loss modes. Since the semiconductor laser device 30 of the present embodiment is configured in this way, lower loss modes (among all possible modes) occur in the resonator when the semiconductor laser device 30 lases.

The energy loss of each mode of oscillation described above means the energy loss that each mode of light incurs when it travels back and forth within the resonator (one round trip). That is, this energy loss is the integration of the energy loss in each infinitesimal section (ΔZ) of the resonator along (back and forth) its length.

(Relationship between Waveguide Modes and Luminance)

FIG. 7 is a schematic diagram showing the paths traveled by representative high and low order waveguide modes of light within the active region, wherein the path traveled by the low order mode of light is represented by a dashed line and indicated by the reference numeral 17 and the path traveled by the high order mode of light is represented by a solid line and indicated by the reference numeral 18. These waveguide modes of light propagate along the length of the resonator (z-direction) while being entirely reflected back and forth between the active region 1 and the cladding regions 2a and 2b.

The low order mode of light has a relatively large angle of incidence θL relative to the cladding regions 2a and 2b, and the high order mode of light has a smaller angle of incidence θH. As described above, the semiconductor laser device 30 is configured so that the energy loss of higher order modes of oscillation is greater than that of lower order modes and hence only low order modes of oscillation can occur in the resonator, making it possible to reduce the divergence angle of the beam emitted from the semiconductor laser device. Thus, in the semiconductor laser device 30, low order modes of oscillation may be selectively produced so as to decrease the divergence angle of the beam emitted from the front facet 24a and thereby increase the brightness (or luminance) of the beam.

Semiconductor laser devices having a tapered stripe region cannot produce high output power. In contrast, the semiconductor laser device 30 of the present embodiment can produce high output power, since the ridge section 20 has a straight ridge structure with a uniform width forming a straight stripe region.

Figure 8:
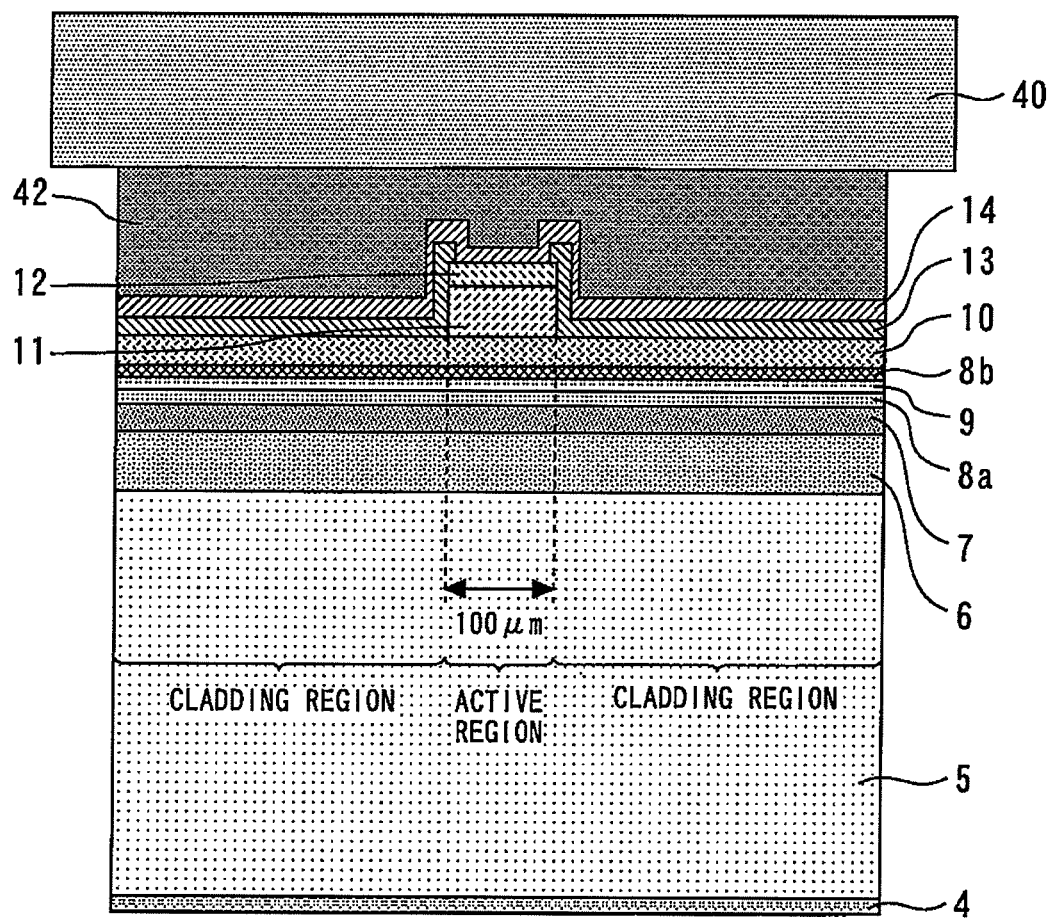
FIG. 8 is a diagram showing the semiconductor laser device of First Embodiment as mounted on a heat sink.
Figure 9:
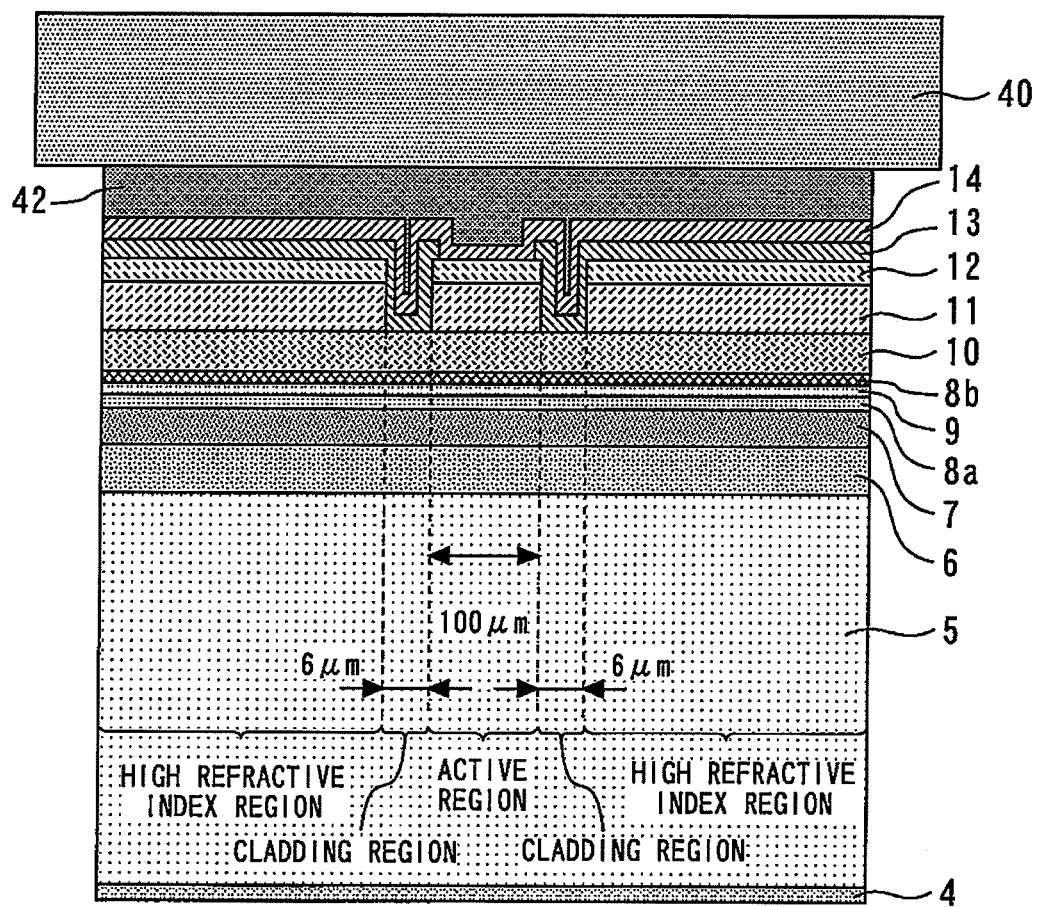
FIG. 9 is a diagram showing the semiconductor laser device of First Embodiment as mounted on a heat sink.

FIGS. 8 and 9 are diagrams showing the semiconductor laser device 30 of the first embodiment as mounted on a heat sink. The cross-sectional view of FIG. 8 is taken along the same line (X-X') as the cross-sectional view of FIG. 3, and the cross-sectional view of FIG. 9 is taken along the same line (Y-Y') as the cross-sectional view of FIG. 4. As shown in FIGS. 8 and 9, the semiconductor laser device 30 is die-bonded to a heat sink 40 by solder 42. The solder 42 electrically, mechanically, and thermally couples the terrace sections 22a and 22b to the heat sink 40, and electrically, mechanically, and thermally couples the first sections 34a and 34b and the second sections 34c and 34d to the heat sink 40.

Semiconductor laser devices having a wide active region, which are referred to as broad area semiconductor laser devices, are typically configured in such a manner that the crystalline growth side of the laser device (i.e., the side on which the ridge section 20 is formed) is die-bonded to a heat sink so as to enhance the heat dissipation from that side, thereby making it possible for the laser device to produce high output power. In this case, the heat sink and the semiconductor laser device are bonded together by solder having good thermal conductivity. Since the thermal conductivity of semiconductor is approximately one order of magnitude lower than solder, if the high refractive index regions 3a and 3b, which are made of semiconductor material, have a large surface area, the thermal dissipation from the semiconductor laser device is reduced.

In order to avoid this, the semiconductor laser device 30 of the first embodiment is configured in such a manner that the high refractive index regions 3a and 3b are provided only in the outer central portions of the cladding regions 2a and 2b, respectively; that is, the terrace sections 22a and 22b are not provided on the first sections 34a and 34b and the second sections 34c and 34d. Since the terrace sections 22a and 22b extend along only the central portion of the length of the resonator and hence are small in area, they do not substantially adversely affect the heat dissipation from the semiconductor laser device. Thus, the semiconductor laser device 30 is configured to have enhanced heat dissipation and hence can produce high output power.

It should be noted that the energy loss of each mode of oscillation and the heat dissipation from the semiconductor laser device differ depending on the composition, material, and dimension of the semiconductor laser device. The length of the high refractive index regions 3a and 3b along the length of the resonator and their area may be determined based on the number of modes of oscillation to be suppressed, the required optical output power, and the required heat dissipation.

As described above, the semiconductor laser device 30 of the present embodiment has a straight stripe structure having a width of 50 μm or more and configured to satisfy Equation (1) above. Further, the high refractive index regions 3a and 3b, which have a higher refractive index than the cladding regions 2a and 2b, are provided in the outer central portions of the cladding regions 2a and 2b, respectively. As a result, in the resonator, higher order modes have higher propagation loss than lower order modes. This means that low order modes of oscillation may be selectively produced by suppressing high order modes of oscillation while ensuring that the semiconductor laser device produces high output power.

Further in the present embodiment, the ridge section 20 has a straight ridge structure with a uniform width, forming a straight stripe region. This enables the semiconductor laser device of the present embodiment to produce higher output power than semiconductor laser devices having a tapered stripe structure.

[Variations of First Embodiment]

Although in the present embodiment the active region 1 has a width of 100 μm, it is to be understood that in other embodiments the active region 1 may have a different width. A broad area semiconductor laser device may be configured in such a manner that its active region has a width of 50 μm or more and the waveguide satisfies Equation (1) described above, which ensures that a plurality of transverse modes of oscillation including the fundamental mode can occur in the waveguide.

Such broad area semiconductor laser devices can also be configured to have the advantages described in connection with the first embodiment.

Further, although in the present embodiment the resonator has a length of 4 mm, it is to be understood that the present invention is not limited to this particular resonator length. The length of the resonator may be varied depending on the required laser output power.

In the present embodiment, the high refractive index regions 3a and 3b are spaced from the active region 1 by the widths (6 μm) of the central portions of the cladding regions 2a and 2b, respectively. That is, the terrace section 22a is spaced from the facing side of the ridge section 20 by a distance of 6 μm, and the terrace section 22b is spaced from the facing side of the ridge section 20 by a distance of 6 μm. However, the present invention is not limited to this particular distance. If the portions of the cladding regions 2a and 2b which separate the high refractive index regions 3a and 3b from the active region 1 are narrowed (that is, if the high refractive index regions 3a and 3b are spaced from the active region 1 by a distance less than 6 μm), then even lower order mode electric fields transmit energy in the x-direction thereby incurring energy loss. If, on the other hand, those portions of the cladding regions 2a and 2b which separate the high refractive index regions 3a and 3b from the active region 1 are widened (that is, if the high refractive index regions 3a and 3b are spaced from the active region 1 by a distance more than 6 μm), then even higher order mode electric fields do not transmit energy in the x-direction resulting in decreased loss in the semiconductor laser device. This means that the widths of the portions of the cladding regions 2a and 2b which separate the high refractive index regions 3a and 3b from the active region 1 may be determined based on the lowest order mode of oscillation which must exhibit increased energy loss.

Further in the present embodiment, the high refractive index regions 3a and 3b are provided in outer central portions of the cladding regions 2a and 2b and extend along a portion of the length of the resonator so that high order modes of oscillation occurring in the resonator incur energy loss. The length of the high refractive index regions 3a and 3b as measured along the length of the resonator is 0.5 mm. However, the present invention is not limited to this particular length.

The energy loss of the modes in the high refractive index regions 3a and 3b increases with increasing length of these regions as measured along the length of the resonator. This means that an increase in the length of the high refractive index regions 3a and 3b results in an increase in the difference between the energy loss of low order modes, which is low enough to be ignored, and the energy loss of high order modes in the resonator.

On the other hand, the energy loss of the modes in the high refractive index regions 3a and 3b decreases with decreasing length of these regions as measured along the length of the resonator. This means that a decrease in the length of the high refractive index regions 3a and 3b results in a decrease in the difference between the energy loss of low order modes, which is low enough to be ignored, and the energy loss of high order modes in the resonator.

In semiconductor lasers, modes of oscillation with lower energy loss are more likely to occur than modes of oscillation with higher energy loss. This means that if there is even a slight difference in energy loss between two modes of oscillation in a resonator, then the mode of oscillation with lower energy loss will dominate or occur. In practice, however, the gain for each mode fluctuates due to spatial hole burning caused when carriers (or current) are injected, etc. Therefore, in order to stably produce a low order mode or modes of oscillation, it is necessary to increase the length of the high refractive index regions 3a and 3b, as measured along the length of the resonator, and thereby increase the difference in energy loss between the low order mode or modes and the higher order modes.

It should be noted that in the first embodiment both the first sections 34a and 34b and the second sections 34c and 34d are lower in height than the ridge section 20 and the terrace sections 22a and 22b. It is to be understood, however, that the present invention is not limited to this particular configuration. Either the first sections 34a and 34b or the second sections 34c and 34d, but not both, may be lower in height than the ridge section 20 and the terrace sections 22a and 22b.

Second Embodiment

Figure 10:
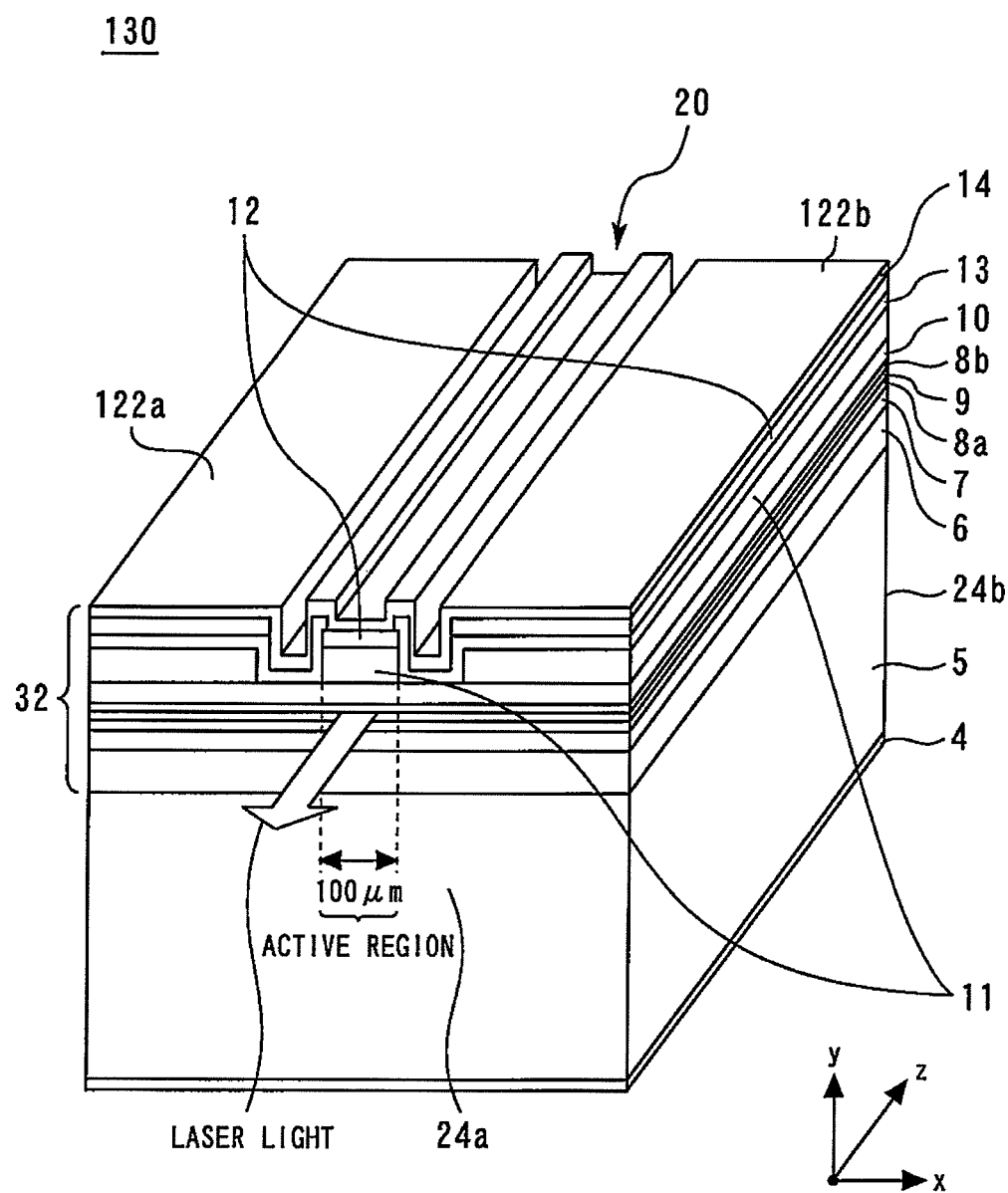
FIG. 10 is a perspective view schematically showing the configuration of a semiconductor laser device in accordance with Second embodiment of the present invention.

FIG. 10 is a perspective view schematically showing the configuration of a semiconductor laser device 130 in accordance with a second embodiment of the present invention. Like the semiconductor laser device 30 of the first embodiment, the semiconductor laser device 130 is a broad area semiconductor laser device and includes an n-type substrate 5, a semiconductor laminated section 32, a ridge section 20, and a pair of terrace sections 122a and 122b. The n-type substrate 5, the semiconductor laminated section 32, and the ridge section 20 of the semiconductor laser device 130 are similar to those of the semiconductor laser device 30 of the first embodiment; however, the shapes of the terrace sections 122a and 122b as viewed in plan are different from those of the terrace sections 22a and 22b of the first embodiment.

Figure 11:
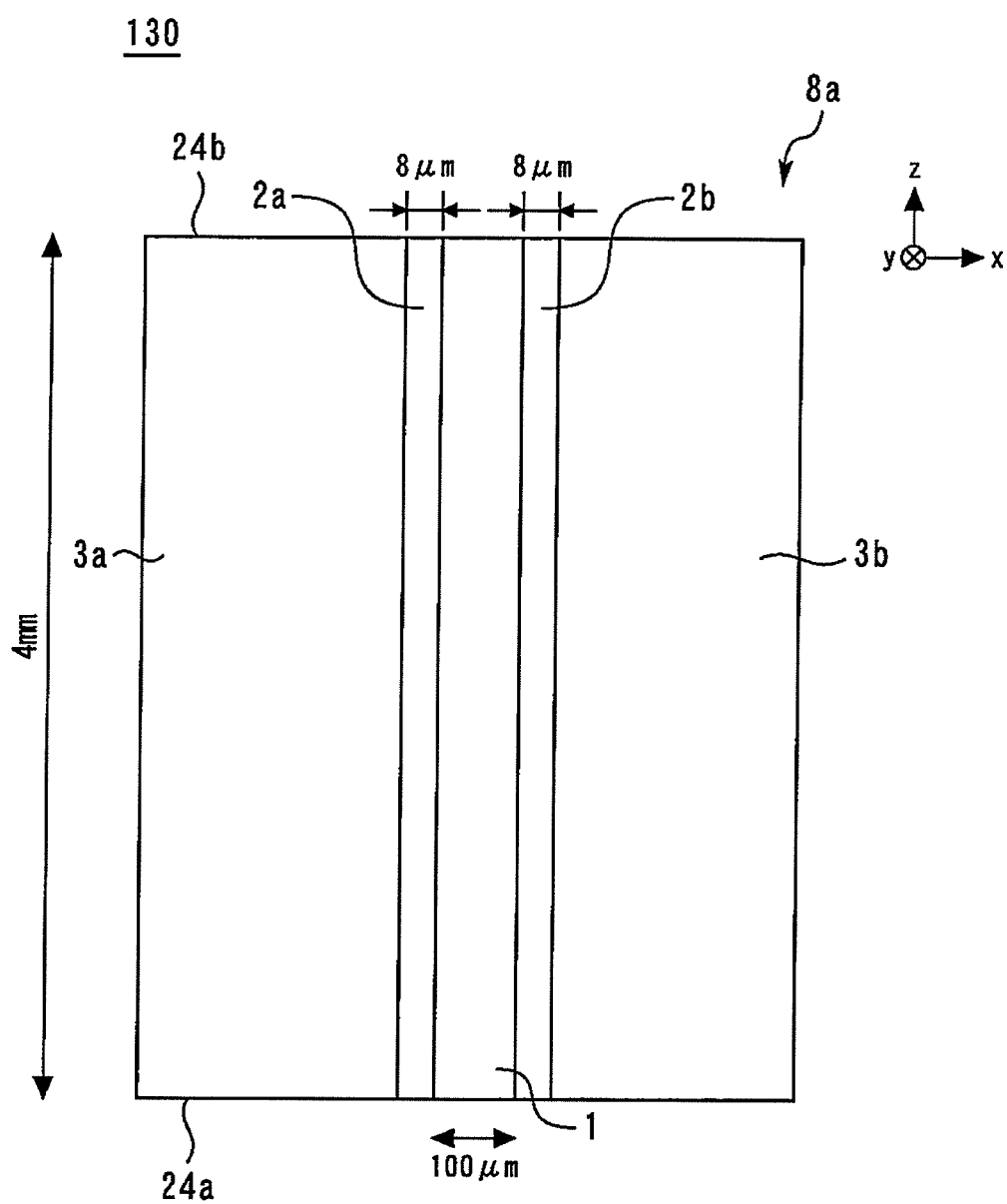
FIG. 11 is a plan view schematically showing the active region, the cladding regions, and the high refractive index regions of the semiconductor laser device of Second Embodiment.

FIG. 11 is a plan view schematically showing the active region, the cladding regions, and the high refractive index regions of the semiconductor laser device 130 of the second embodiment. FIG. 11 corresponds to FIG. 2 described in connection with the first embodiment. The active region and the high refractive index regions, shown in a plan view in FIG. 11, correspond to the ridge section 20 and the terrace sections 122a and 122b, respectively, of the semiconductor laser device 130 as viewed from above the ridge section 20. Thus, the views of FIGS. 10 and 11 are related in the same manner as the views of FIGS. 1 and 2 described in connection with the first embodiment.

In the semiconductor laser device 130 of the second embodiment, the high refractive index regions 3a and 3b extend along the entire length of the resonator. That is, the terrace sections 122a and 122b extend along the entire length of the resonator (i.e., extend from the front facet 24a to the rear facet 24b). The semiconductor laser device 130 has a uniform cross-section similar to that shown in FIG. 4 except that the cladding regions (or low refractive index regions) 2a and 2b between the active region 1 and the high refractive index regions 3a and 3b, respectively, have a width of 8 μm, instead of 6 μm.

Since the high refractive index regions 3a and 3b extend along the entire length of the resonator, the widths of the cladding regions (or low refractive index regions) can be increased while ensuring that there is an adequate difference in energy loss between low order modes and high order modes. Therefore, in the second embodiment, as in the first embodiment, it is possible to selectively produce low order modes of oscillation with low energy loss.

It should be noted that although in the present embodiment the cladding regions (or low refractive index regions) have a width of 8 μm, it is to be understood that the present invention is not limited to this particular width. The terrace sections 122a and 122b may be spaced from the ridge section 20 by a distance more or less than 8 μm. That is, the distance between the ridge section 20 and the terrace sections 122a and 122b may be varied depending on the required difference in energy loss between high and low order modes of oscillation in the resonator.

It should be noted that in the present embodiment the terrace sections 122a and 122b extend along the entire length of the resonator of the semiconductor laser device 130 (i.e., extend in the z-direction in FIGS. 10 and 11) and have a uniform width. As a result of this configuration, the heat dissipation from the active layer of the semiconductor laser device 130 is lower than that from the active layer of the semiconductor laser device 30 of the first embodiment. However, it is still possible to selectively produce low order modes of oscillation.

Third Embodiment

Figure 12:
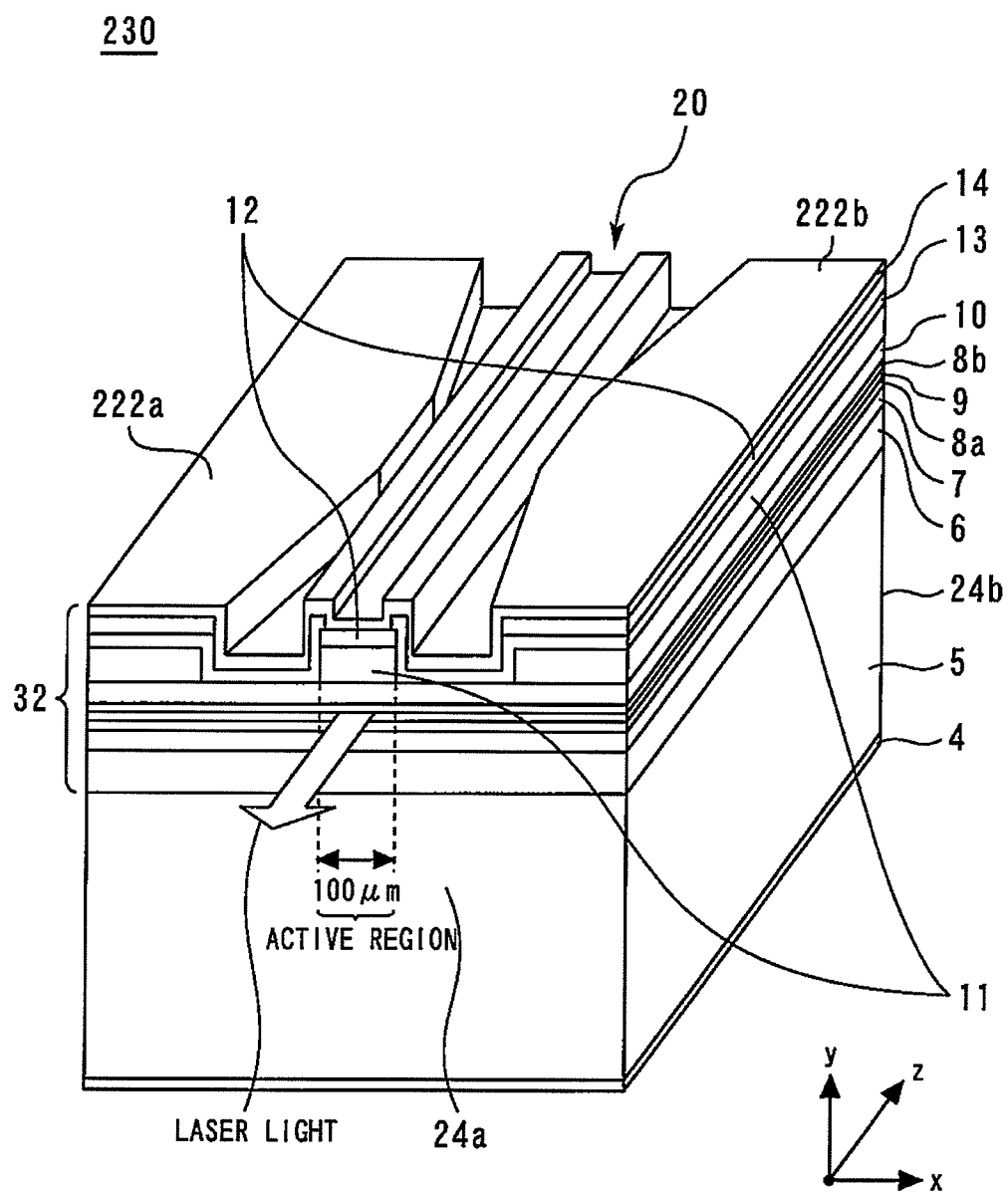
FIG. 12 is a perspective view schematically showing the configuration of a semiconductor laser device in accordance with Third embodiment of the present invention.

FIG. 12 is a perspective view schematically showing the configuration of a semiconductor laser device 230 in accordance with a third embodiment of the present invention. Like the semiconductor laser device 30 of the first embodiment, the semiconductor laser device 230 is a broad area semiconductor laser device and includes an n-type substrate 5, a semiconductor laminated section 32, a ridge section 20, and a pair of terrace sections 222a and 222b. The n-type substrate 5, the semiconductor laminated section 32, and the ridge section 20 of the semiconductor laser device 230 are similar to those of the semiconductor laser device 30 of the first embodiment; however, the shapes of the terrace sections 222a and 222b as viewed in plane are different from those of the terrace sections 22a and 22b of the first embodiment.

Figure 13:
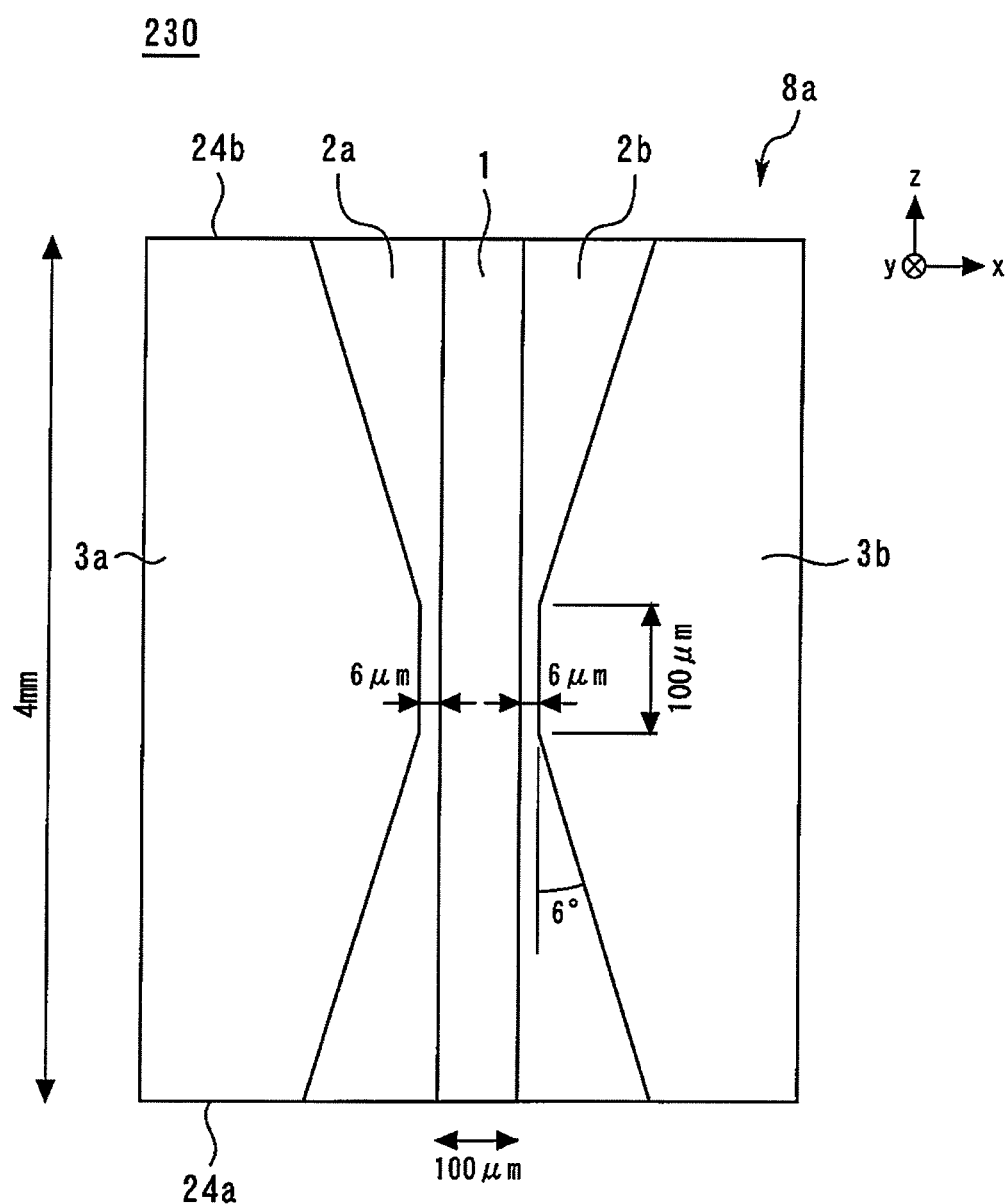
FIG. 13 is a plan view schematically showing the active region, the cladding regions, and the high refractive index regions of the semiconductor laser device of Third Embodiment.

FIG. 13 is a plan view schematically showing the active region, the cladding regions, and the high refractive index regions of the semiconductor laser device 230 of the third embodiment. FIG. 13 corresponds to FIG. 2 described in connection with the first embodiment. The active region and the high refractive index regions, shown in a plan view in FIG. 13, correspond to the ridge section 20 and the terrace sections 222a and 222b, respectively, of the semiconductor laser device 230 as viewed from above the ridge section 20. Thus, the views of FIGS. 12 and 13 are related in the same manner as the views of FIGS. 1 and 2 described in connection with the first embodiment.

In the semiconductor laser device 230, the terrace sections 222a and 222b are configured in such a manner that the distances between the ridge section 20 and the facing sides of the terrace sections 222a and 222b increase with increasing distance from the central portion of the length of the ridge section 20 (extending along the length of the resonator) and decreasing distance from the front facet 24a, and also increase with increasing distance from the central portion of the length of the ridge section 20 and decreasing distance from the rear facet 24b. As a result of this configuration, the central portions of the cladding regions (or low refractive index regions) 2a and 2b between the central portion of the ridge section 20 and the terrace sections 222a and 222b, respectively, have a width of 6 μm and a length of 100 μm. The cladding regions 2a and 2b increase in width from their central portion toward their edges on the front facet 24a side and the rear facet 24b side of the semiconductor laminated section 32.

In the first embodiment, the high refractive index regions 3a and 3b are surrounded by the cladding regions (or low refractive index regions) 2a and 2b, respectively. Therefore, when light propagating in the resonator goes across the boundaries between the high and low refractive index regions, the light experiences a considerable change in the refractive index to which it is subjected. As a result, waveguide modes propagating through the active region 1 become unstable since they are disturbed at these boundaries and some of them are combined with radiation modes.

In order to prevent the modes from becoming unstable at boundaries between the high and low refractive index regions, in the third embodiment the cladding regions (or low refractive index regions) increase in width from their central portion toward their edges on the front facet 24a side and the rear facet 24b side of the semiconductor laminated section 32; more specifically, the configuration of each cladding region, as viewed in plan, includes two tapered shapes having a taper angle of 6 degrees, as shown in FIG. 13. As a result, the light propagating through the active region 1 experiences only a gradual change in the refractive index to which it is subjected. The energy loss of the high order modes of light increases as they approach the central portions of the cladding regions, which portions have a width of 6 µm. The energy loss of the low order modes of light, on the other hand, does not substantially change (i.e., remains substantially constant) as they approach the central portions of the cladding regions, resulting in oscillation in these low order modes.

Further, the cladding regions (or low refractive index regions) 2a and 2b are wide adjacent the front facet 24a and the rear facet 24b, making it possible to effectively transfer the heat generated in the active layer to the heat sink and thereby prevent degradation of these facets due to increased temperature.

Although, as described above, the configuration of each cladding region (or low refractive index region) 2a, 2b, as viewed in plan, includes two tapered shapes having a taper angle of 6 degrees, it is to be understood that the present invention is not limited to this particular taper angle. The taper angle may be reduced to reduce disturbance of the waveguide modes. Further, although in the third embodiment the tapered shapes of the cladding regions described above linearly taper toward the central portions of the cladding regions, it is to be understood that they may taper nonlinearly. Further, although in the third embodiment the central portions of the high refractive index regions 3a and 3b adjacent the active region 1 has a length of 100 µm, it is to be understood that the present invention is not limited to this particular length.

It should be noted that the terrace sections 222a and 222b may be configured in such a manner that the distances between the ridge section 20 and the facing sides of these terrace sections increase with decreasing distance from either the front facet 24a or rear facet 24b, but not both.

Fourth Embodiment

Figure 14:
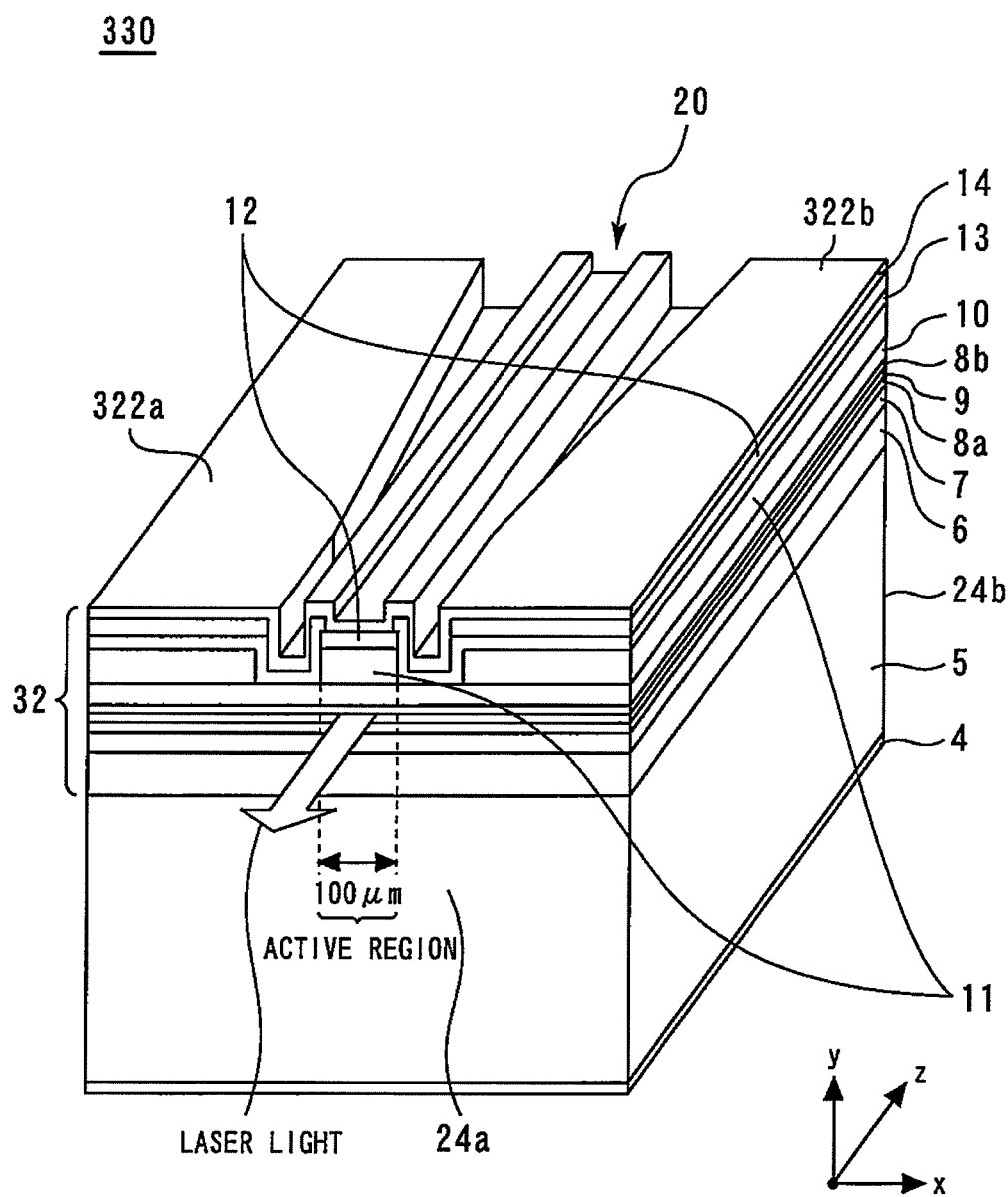
FIG. 14 is a perspective view schematically showing the configuration of a semiconductor laser device in accordance with Fourth embodiment of the present invention.

FIG. 14 is a perspective view schematically showing the configuration of a semiconductor laser device 330 in accordance with a fourth embodiment of the present invention. Like the semiconductor laser device 30 of the first embodiment, the semiconductor laser device 330 is a broad area semiconductor laser device and includes an n-type substrate 5, a semiconductor laminated section 32, a ridge section 20, and a pair of terrace sections 322a and 322b. the n-type substrate 5, the semiconductor laminated section 32, and the ridge section 20 of the semiconductor laser device 330 are similar to those of the semiconductor laser device 30 of the first embodiment; however, the shapes of the terrace sections 322a and 322b as viewed in plan are different from those of the terrace sections 22a and 22b of the first embodiment.

Figure 15:
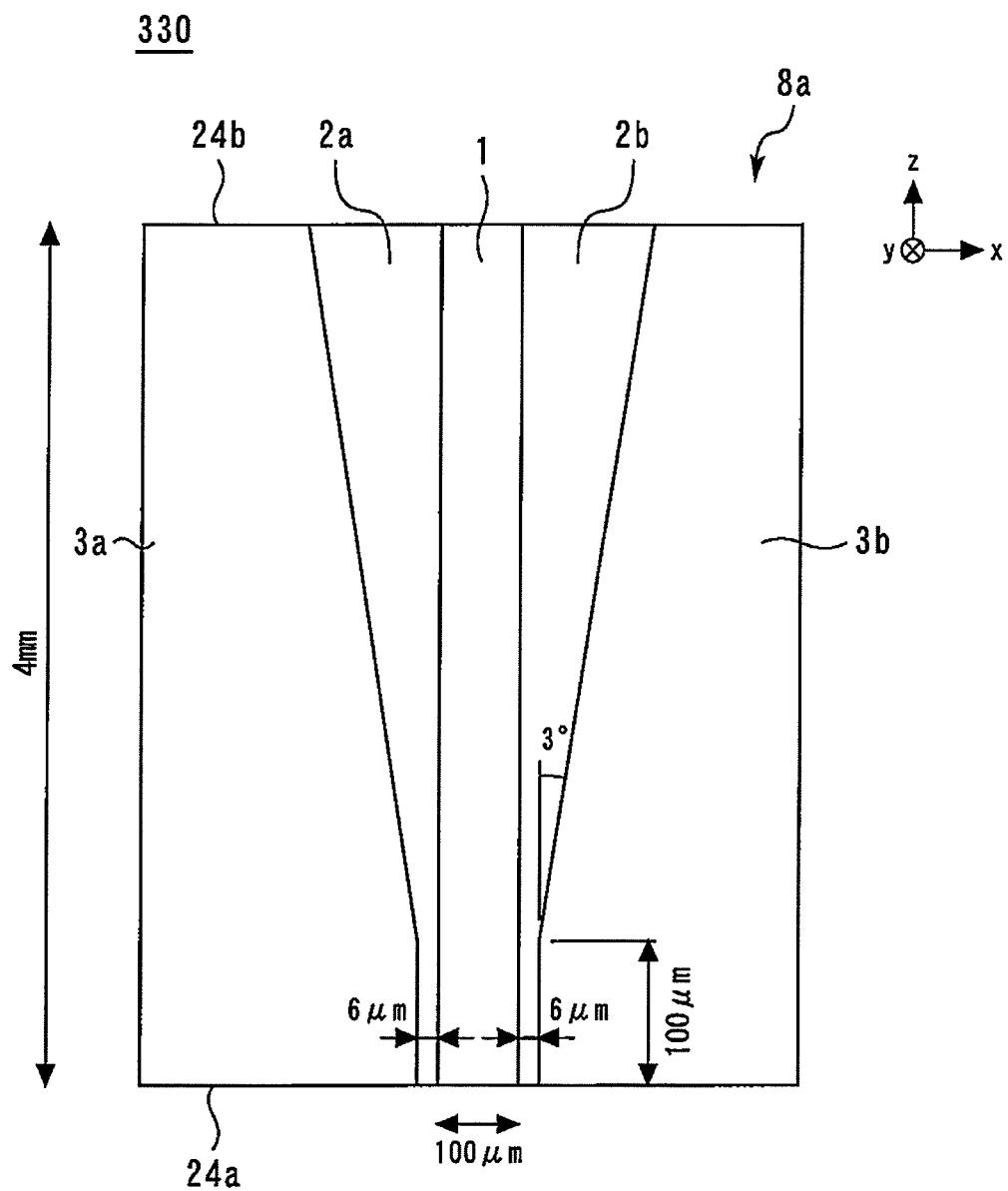
FIG. 15 is a plan view schematically showing the active region, the cladding regions, and the high refractive index regions of the semiconductor laser device of Fourth Embodiment.

FIG. 15 is a plan view schematically showing the active region, the cladding regions, and the high refractive index regions of the semiconductor laser device 330 of the fourth embodiment. FIG. 15 corresponds to FIG. 2 described in connection with the first embodiment. The active region 1 and the high refractive index regions 3a and 3b, shown in a plan view in FIG. 15, correspond to the ridge section 20 and the terrace sections 322a and 322b, respectively, of the semiconductor laser device 230 as viewed from above the ridge section 20. Thus, the views of FIGS. 14 and 15 are related in the same manner as the views of FIGS. 1 and 2 described in connection with the first embodiment.

In the semiconductor laser device 330, the terrace sections 322a and 322b are configured in such a manner that the distances between the ridge section 20 and the facing sides of these terrace sections increase with increasing distance from the front facet 24a and decreasing distance from the rear facet 24b.

The end portions of the cladding regions (or low refractive index regions) 2a and 2b on the front facet 24a side of the semiconductor laminated section 32 have a width of 6 µm and a length of 100 µm, and the cladding regions 2a and 2b increase in width with decreasing distance from the rear facet 24b in such a manner that these cladding regions 2a and 2b have a tapered configuration having a taper angle of 3 degrees. As a result, light propagating through the active region 1 does not experience a sudden change in the refractive index to which it is subjected. This means that the energy loss of the high order modes of light gradually increases as they travel through the active region 1, and the energy loss of the low order modes of light does not substantially increase as they travel through the active region 1, resulting in oscillation in these low order modes.

In the present embodiment, the end portions of the cladding regions (or low refractive index regions) 2a and 2b on the front facet 24a side of the semiconductor laminated section 32 are narrower than the other portions of the cladding regions 2a and 2b.Further, the cladding regions (or low refractive index regions) 2a and 2b widen toward the rear facet 24b, that is, the cladding regions 2a and 2b increase in width with increasing distance from the front facet 24a and decreasing distance from the rear facet 24b. This means that they have a tapered shape (as viewed in plan) having a taper angle which is smaller than would be the case if the central portions of the cladding regions 2a and 2b were narrow and the cladding regions 2a and 2b increased in width toward the front facet 24a and toward the rear facet 24b (as in the third embodiment). As a result, light propagating through the active region 1 experiences a more gradual change in the refractive index to which it is subjected.

When the cladding regions 2a and 2b are wide adjacent a facet of the semiconductor laminated section 32 (or resonator), the active layer (including the undoped InGaAs well layer 8b, the undoped AlGaAs barrier layer 9, and the undoped InGaAs well layer 8b) adjacent that facet is closer to the p-electrode 14 than, e.g., the active layer under the terrace sections. This makes it possible to enhance the heat dissipation from the active layer. The cladding regions (or low refractive index regions) 2a and 2b may be configured to be wide adjacent the front facet 24a to prevent degradation of that facet due to increased temperature, since laser light is emitted primarily through the front facet 24a.

In the present embodiment, the end portions (or the narrowest portions) of the cladding regions (or low refractive index regions) 2a and 2b on the front facet 24a side of the semiconductor laminated section 32 have a width of 6 µm, and the cladding regions 2a and 2b increase in width with decreasing distance from the rear facet 24b in such a manner that the cladding regions 2a and 2b have a tapered configuration having a taper angle of 3 degrees as viewed in plan. Further, the end portions of the high refractive index regions 3a and 3b on the front facet 24a side of the semiconductor laminated section 32 (i.e., the closest portions of the high refractive index regions 3a and 3b to the active region 1) have a length of 100 µm. However, the present invention is not limited to this particular configuration. As described above in connection with the first embodiment, the dimensions of these regions may be determined based on the lowest order mode of oscillation which must exhibit increased energy loss, the required difference in energy loss between modes, and the required heat dissipation.

Contrary to the fourth embodiment, the terrace sections 322a and 322b may be configured in such a manner that the distances between the ridge section 20 and the facing sides of these terrace sections increase with increasing distance from the rear facet 24b and decreasing distance from the front facet 24a.

Although the first to fourth embodiments have been described in connection with 980 nm broad area semiconductor lasers, it is to be understood that the present invention is not limited to this particular type of broad area semiconductor laser. The present invention may be applied to broad area semiconductor lasers lasing at different wavelengths, such as 400 nm blue-violet broad area semiconductor lasers, 500 nm blue broad area semiconductor lasers, 800 nm near-infrared broad area semiconductor lasers, and 1000 nm or more broad area semiconductor lasers.

Although in the embodiments of the present invention the active region 1 and the high refractive index regions 3a and 3b have the same laminated structure and hence have the same refractive index, it is to be understood that the present invention is not limited to this particular feature. The active region 1 may be etched or subjected to additional crystalline growth so that the active region 1 has a refractive index higher or lower than that of the high refractive index regions 3a and 3b. In this case, as in the above embodiments of the present invention, it is possible to selectively produce low order modes of oscillation. Further, the high refractive index regions 3a and 3b may be etched or subjected to additional crystalline growth so that the high refractive index regions 3a and 3b have a refractive index higher or lower than that of the active region 1.

The features and advantages of the present invention may be summarized as follows. The present invention provides a broad area semiconductor laser device capable of emitting increased intensity light.

Obviously many modifications and variations of the present invention are possible in the light of the above teachings. It is therefore to be understood that within the scope of the appended claims the invention may by practiced otherwise than as specifically described.

The entire disclosure of Japanese Patent Application No. 2012-224367, filed on Oct. 9, 2012, including specification, claims, drawings, and summary, on which the Convention priority of the present application is based, is incorporated herein by reference.

What is claimed is:

1. A semiconductor laser device comprising:
a semiconductor substrate;
a semiconductor laminated section which includes a first conductivity type cladding layer, an active layer, and a second conductivity type cladding layer, sequentially stacked on the semiconductor substrate, and which has a front facet and a rear facet transverse to a resonator length direction;
a ridge section located on a top of the semiconductor laminated section; and
a pair of terrace sections located on the top of the semiconductor laminated section, and sandwiching and spaced from the ridge section, wherein
the ridge section has a width of at least 50 µm,
the active layer is divided into an active region, a pair of under-the-terrace-section regions, and a pair of cladding regions, wherein the active region is located below the ridge section, as viewed in plan from the top of the semiconductor laminated section, the under-the-terrace-section regions are located on opposite sides of the active region and each of the under-the-terrace regions is located below a respective one of the pair of terrace sections, as viewed in plan from the top of the semiconductor laminated section, each of the cladding regions located between the active region and a respective one of the pair of under-the-terrace-section regions, and the under-the-terrace-section regions have a higher effective refractive index than the cladding regions due to location opposite respective ones of the pair of terrace sections,
the semiconductor laser device satisfies $$(2\pi/\lambda) \times (n_a^2 - n_c^2)^{1/2} \times (W/2) > \pi/2,$$

where $\lambda$ represents lasing wavelength of the semiconductor laser device, $n_a$ represents effective refractive index of the active region, $n_c$ represents effective refractive index of the cladding regions, and W represents the width of the active region,
the pair of terrace sections sandwich a central portion of a length of the ridge section, the length of the ridge section extending, in the resonator length direction,
a top portion of the semiconductor laminated section includes first sections sandwiching an end portion of the ridge section on a front facet side of the semiconductor laminated section, and second sections sandwiching an end portion of the ridge section on a rear facet side of the semiconductor laminated section and the first and second sections sandwich the terrace sections, as viewed in plan from the top of the semiconductor laminated section, and
the first sections and/or the second sections are closer to the semiconductor substrate than are the ridge section and the pair of terrace sections.

2. The semiconductor laser device according to claim 1, further comprising a heat sink connected by a thermally conductive material to the first sections and/or the second sections.

3. The semiconductor laser device according to claim 1, wherein the ridge section has a straight stripe structure extending from the front facet to the rear facet and having a uniform width.

* * * * *